(12) United States Patent
Beaudry

(10) Patent No.: US 7,439,093 B2
(45) Date of Patent: Oct. 21, 2008

(54) METHOD OF MAKING A MEMS DEVICE CONTAINING A CAVITY WITH ISOTROPIC ETCH FOLLOWED BY ANISOTROPIC ETCH

(75) Inventor: Richard Beaudry, Quebec (CA)

(73) Assignee: DALSA Semiconductor Inc., Waterloo, ON (CA)

( * ) Notice: Subject to any disclaimer, the term of this patent is extended or adjusted under 35 U.S.C. 154(b) by 439 days.

(21) Appl. No.: 11/227,065

(22) Filed: Sep. 16, 2005

(65) Prior Publication Data

US 2007/0065967 A1  Mar. 22, 2007

(51) Int. Cl.
*H01L 21/00* (2006.01)
*H01L 21/302* (2006.01)

(52) U.S. Cl. .............................. 438/48; 438/50; 438/52; 438/712; 438/739

(58) Field of Classification Search .................... 438/48, 438/50, 52, 712, 739
See application file for complete search history.

(56) References Cited

U.S. PATENT DOCUMENTS

| | | | |
|---|---|---|---|
| 5,501,893 A | 3/1996 | Laermer et al. | |
| 6,127,273 A | 10/2000 | Laermer et al. | |
| 6,500,348 B2 | 12/2002 | Chase et al. | |
| 6,685,844 B2 | 2/2004 | Rich et al. | |
| 6,767,614 B1 * | 7/2004 | Hofmann et al. | ............. 428/166 |
| 2002/0179246 A1 * | 12/2002 | Garabedian et al. | ...... 156/345.3 |
| 2003/0210799 A1 | 11/2003 | Gabriel et al. | |
| 2005/0009226 A1 * | 1/2005 | Kumagai et al. | .............. 438/69 |

FOREIGN PATENT DOCUMENTS

| | | |
|---|---|---|
| EP | 1441561 A2 | 7/2004 |
| EP | 1529753 A2 | 5/2005 |

* cited by examiner

*Primary Examiner*—Thanh Nguyen
(74) *Attorney, Agent, or Firm*—Marks & Clerk; Richard J. Mitchell

(57) ABSTRACT

A method of making an etch structure in a substrate involves the steps of providing a mask on a substrate with a pattern that leaves at least one opening leaving the substrate in direct contact with the ambient, performing an isotropic or quasi-isotropic etch through a mask to create a cavity under the mask, which mask is left behind as a suspended membrane above the cavity; and performing a subsequent anisotropic etch that etches anisotropically the pattern of the mask in the bottom of the cavity.

20 Claims, 14 Drawing Sheets

(Cross-section)

(Top view)

(Cross-section)

(Top view)

(Cross-section) (Top view)

METHOD OF MAKING A MEMS DEVICE CONTAINING A CAVITY WITH ISOTROPIC ETCH FOLLOWED BY ANISOTROPIC ETCH

FIELD OF THE INVENTION

This invention relates to the field of MEM (microelectromechanical) devices, and in particular to a method of making an etched structure in such devices.

BACKGROUND OF THE INVENTION

One way of making a micro microphone as a microelectomechanical systems (MEMS) device is to produce required vent holes below a metal grid, which is above a resonance cavity. A simple way to create this structure is to etch deep holes through the metal grid, flip the substrate up side down and etch the cavity, (or vice-versa). This uses and Inductively Coupled Plasma (ICP) to etch straight wall holes with Deep Reactive Ion Etching (DRIE) technique. More specifically, one can use the process described in U.S. Pat. No. 5,501,893, or 6,127,273, called Bosch process to produce both processing steps.

However, the main disadvantage with this approach lies in the step where the metal is exposed to the plasma when etching through the metal grid because metal sputtering can impair the properties of the ICP reactor. This causes a long-term drift of the etching characteristics as the metal is sputtered on the chamber walls. The coating of the chamber walls with the sputtered metal causes a parasitic capacitor that changes the impedance of the chamber. This parameter is essential for a good control of the etch profiles.

Other methods were explored as described in the next section; however, they all result in more processing steps and higher costs. Furthermore, standard techniques would require the utilisation of, at least, two masks and two etching steps while the present invention utilizes only one mask to create holes in the bottom of a cavity.

Isotropic and anisotropic plasma etching is widely used to fabricate micro-machined structures and devices. They are generally used separately to remove or define some geometry in a specific layer. The geometries are generally defined with photolithography technique that leaves the image of the photolithographic mask in a photoresist. This pattern is then duplicated by etching one or a few layers under it using different etching techniques.

More specifically, MEMS processes generally use deep reactive ion etching (DRIE) to form structures with high aspect ratios. The geometries are generally critical in such systems, and non-conventional approaches are often utilised to get the desired shape. Different anisotropic techniques were previously invented using different shrewdness to accomplish etch shapes with high aspect ratios. This is either done by carefully adjust etching and passivation species, by switching etching and passivation species alternatively or by using physical bombardment or intrinsic physical properties of the substrate to create a directionality [e.g. TMAH etching].

One object of the present invention is to form an etched pattern in the bottom of a cavity. Various techniques were considered. One such technique is wafer bonding. FIG. 1a to FIG. 1f summarize the process. One would etch a pattern in a substrate (FIG. 1b), etch a cavity in a second substrate (FIG. 1d) and then, create a permanent contact bonding between the two substrates with a prior alignment to fix the cavity at the desire position relative to the pattern. This solution is expensive since two substrates are needed and the cavity substrate often needs to be back grinded to get the desired thickness or to open the cavity. The later leads into a depth of the cavity difficult to control and leads to large variation across the wafer.

A second technique uses the spray coating technique. It starts first with an anisotropic or isotropic etch to create the desire cavity (FIG. 2a to 2b), then is followed by the removal of the etching mask (FIG. 2c). Then, a spray coater is used to coat the walls and the bottom of the cavity with photoresist (FIG. 2d). A photolithography mask aligner able to project the photolithography mask image in the bottom of the cavity without distortion (with a large depth of field) is then used to create the pattern in the bottom of the cavity (FIG. 2e). Finally, DRIE (Deep Reactive Ion Etch) is used to imprint the pattern in the bottom of the cavity (FIG. 2f). This technique is greatly limited in the depth of the cavity. Greater the depth of the cavity worse is the resolution of the pattern in the bottom of the cavity.

A third technique is possible when the pattern in the bottom of the cavity is extended throughout the whole substrate. This can be accomplished by creating the cavity on one side of the substrate with the desired depth (FIG. 2d), and then the substrate is flipped over and a second mask is patterned on the other side (aligned with the first one: FIG. 3a). Finally, the DRIE is used to etch the pattern and reach the cavity (FIG. 3b). Either the cavity or the pattern can be done first. This solution implies handling of the two side of the wafer and the thickness of the substrate need to be very uniform. Furthermore, when etching the second side (either the cavity or the pattern), at the point where the cavity depth reach the "bottom" of the etched pattern or vice versa, lost of dimensions is generally seen. This can be due to lost of the backside cooling if using DRIE. It leads to erosion of the pattern. When etching the cavity in second, sidewall passivation of the pattern (left over by DRIE or protective layer to preserve the dimensions) can create micro-masking leading to unwanted re-entrant contour walls in the cavity. This is explained in U.S. Pat. Nos. 6,500,348 and 6,685,844 where they propose solution to minimize this effect.

If the patterned holes do not need to breakthrough the wafer, a second wafer substrate is needed, with optional back grinding if a specific thickness is needed.

All above techniques need many processing steps to create etched patterns in the bottom of a cavity. This leads to high costs and pour throughput for the overall process.

SUMMARY OF THE INVENTION

The invention provides a method of forming a micro-machined structure in a substrate, by etching a cavity in the substrate under a protective mask and etching the pattern of the mask in the bottom of the cavity using dry plasma etching technique. This uses a single mask to form both a cavity and the etched structures imprinted in the bottom of the cavity. The method includes optionally forming at least one micro-machined structure, in which a mask with the necessary minimum strain is used to etch the substrate and create a cavity under the mask. The pattern of the mask is then duplicated in the bottom of the cavity using the DRIE. This leaves a suspended membrane on top of the cavity, which can be optionally stripped away with a selective, etch.

Accordingly the present invention provides a method of making an etch structure in a substrate comprising providing a mask on the substrate with a pattern that leaves at least one opening exposing the substrate to the ambient; performing an isotropic or quasi-isotropic etch through the mask to create a cavity under the mask, which mask is left behind as a suspended membrane above the cavity; and performing a subsequent anisotropic etch that etches anisotropically a pattern of holes corresponding to the pattern of the mask in the bottom of the cavity.

With the present invention, only one patterned mask is needed to create the cavity and the pattern and that, in one single piece of equipment. This is a great advantage over other methods, reducing processing time and processing cost.

The method according to the present invention has an advantage over the related art that creates pattern in the bottom of the cavity since only one patterned mask is necessary.

The method intended in the present invention contains three main steps. First, a hard mask is form leaving the substrate exposed at the desired regions. Second, an inductively coupled plasma (ICP) DRIE system or equivalent dry plasma etching technique is used to expose the surface with species that react spontaneously with the substrate. This etches the substrate isotropically or quasi-isotropically creating a cavity under each opening. This cavity can be further etched such that the surrounded cavities under surrounded openings will merge to generate a large cavity under the mask, which further becomes a membrane above a cavity. Third, within the same equipment (or in another one if desired), which is capable to etch large aspect ratio holes, the process conditions are switch into an anisotropic etching (this is usually done in an ICP DRIE system). Then creating an etch pattern, identical to the pattern in the mask but with higher aspect ratio. This leaves a pattern in the bottom of the cavity. Optionally, the mask can be removed by selective stripping.

In the invention the shape of the cavity is determined by the desired pattern in the bottom of the cavity. Also the sharpness of the sidewalls of the pattern in the bottom of the cavity is more difficult to obtain as with standard DRIE processes, so the process needs to be well tuned in order to minimize diversion of enchants during DRIE etching. Otherwise, enlargement of the structure is seen in the reproduced etch pattern.

The invention is particularly applicable to the manufacture of micro microphones, but one skilled in the art will appreciate that it can be applied to the fabrication of other like structures.

DETAILED DESCRIPTION OF THE DRAWINGS

The invention will now be described in more detail, by way of example only, with reference to the accompanying drawings, in which:

FIG. 3b is a diagram of the substrate shown in 3a after DRIE etching of the pattern in FIG. 3a;

DETAILED DESCRIPTION OF THE PREFERRED EMBODIMENTS

Figure 1A:
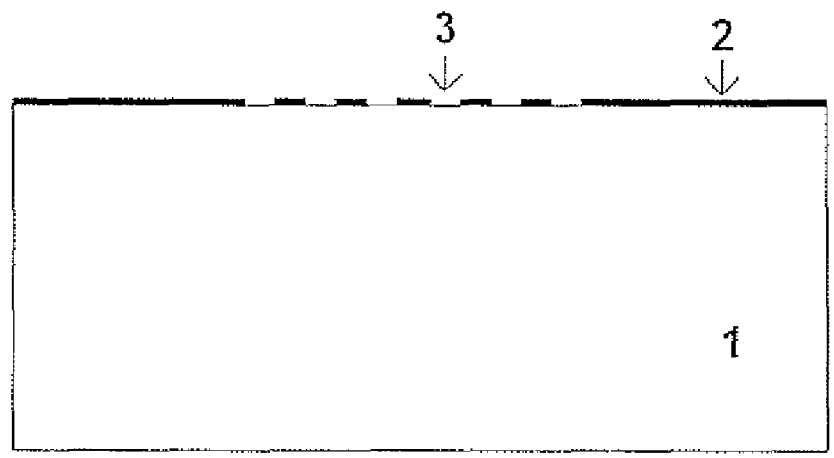
FIG. 1a is a diagram of the openings made in a photoresist mask on the first substrate.
Figure 1B:
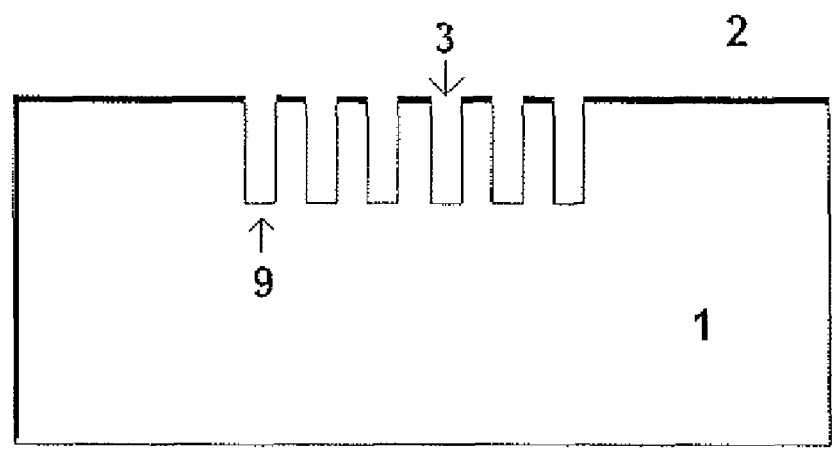
FIG. 1b is a diagram of the substrate in FIG. 1a after DRIE etching of the pattern.
Figure 1C:
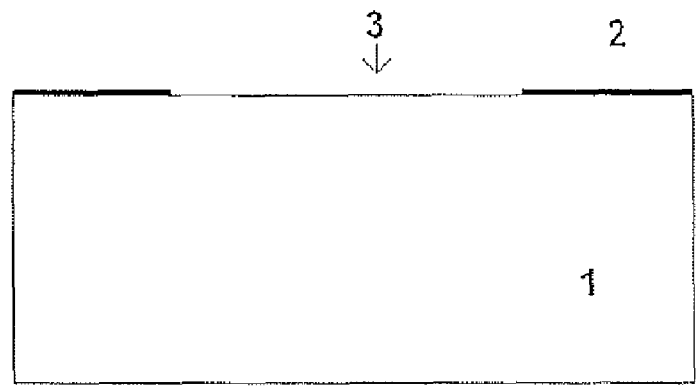
FIG. 1c is a diagram of the 2nd substrate with openings for the cavity mask.
Figure 1D:
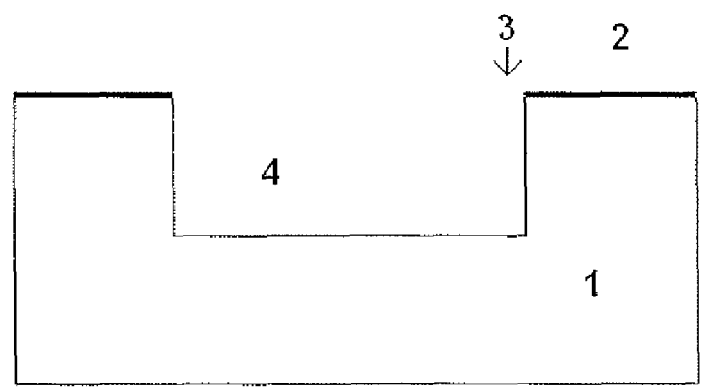
FIG. 1d is a diagram of the 2nd substrate after etching of the cavity.
Figure 1E:
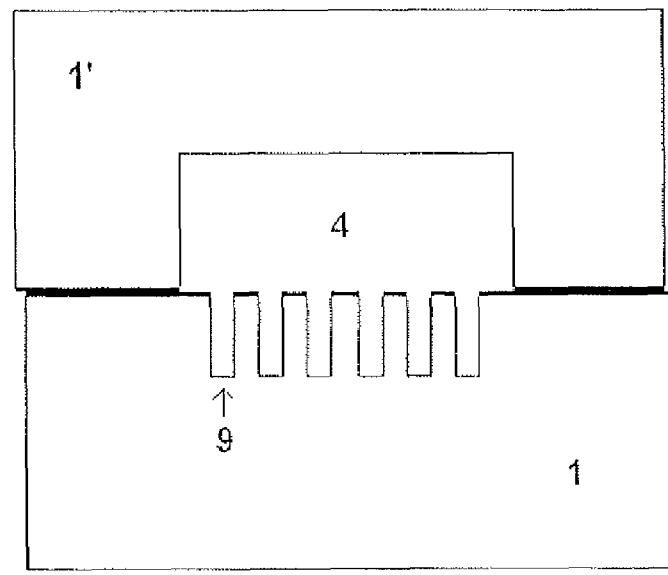
FIG. 1e is a diagram of the bonding of the two substrates shown in FIGS. 1d and 1b.
Figure 1F:
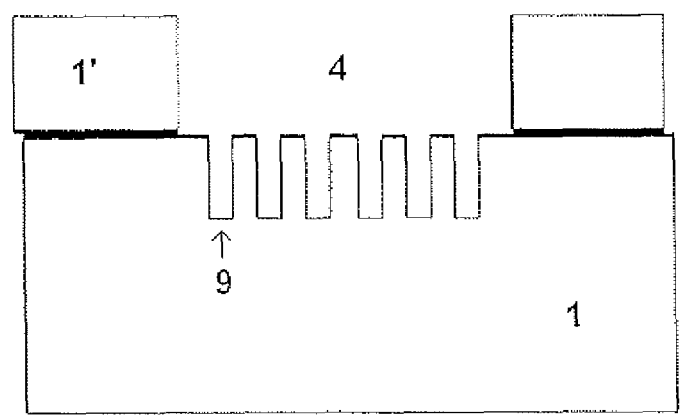
FIG. 1f is a diagram of the two bonded substratew after back grinding.
Figure 2A:
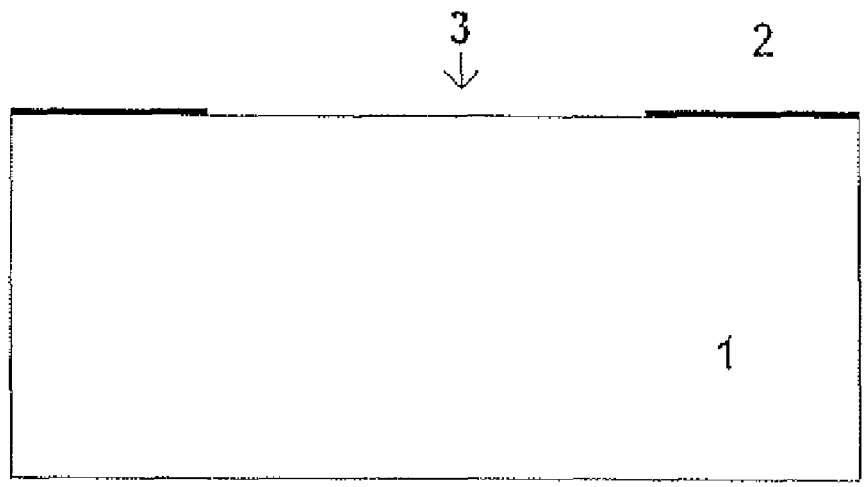
FIG. 2a is a diagram of the substrate with openings in a photoresist mask (the cavity mask)
Figure 2B:
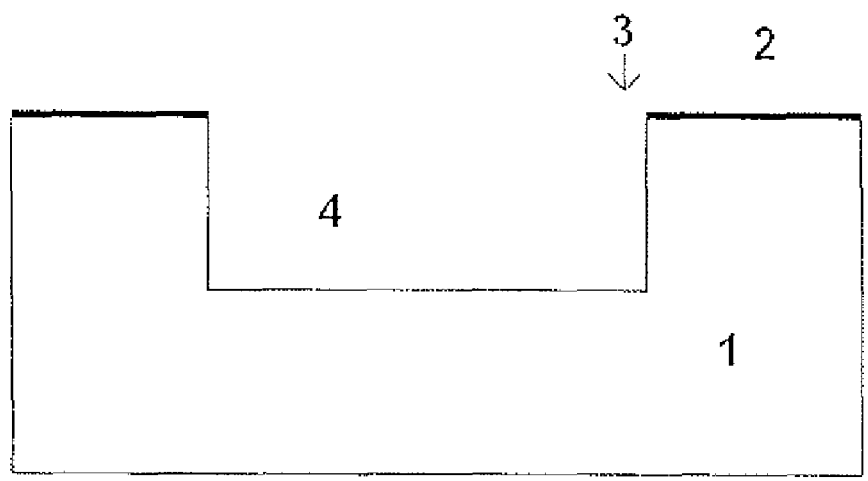
FIG. 2b is a diagram of the substrate after etching of the cavity.
Figure 2C:
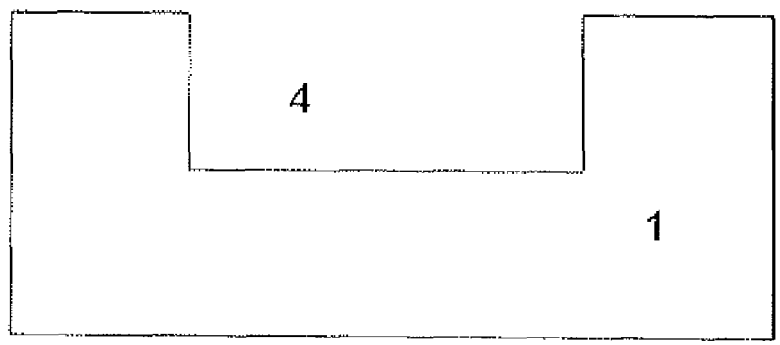
FIG. 2c is a diagram of the substrate after stripping of the resist.
Figure 2D:
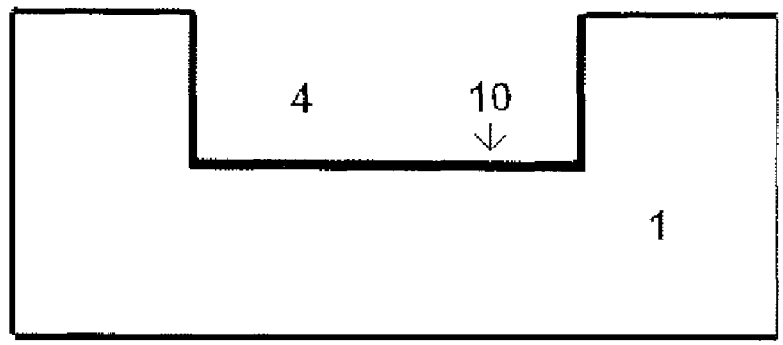
FIG. 2d is a diagram of the substrate after spray coating photoresist.
Figure 2E:
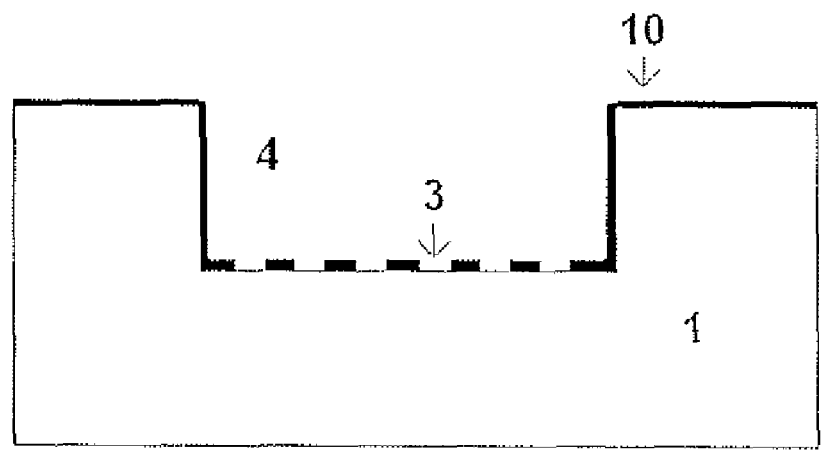
FIG. 2e is a diagram of the substrate after exposing and developing of the spray coated photoresist.
Figure 2F:
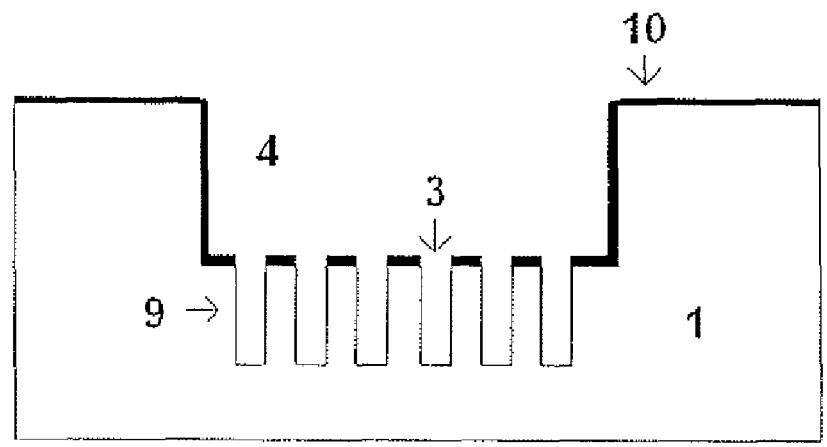
FIG. 2f is a diagram of the substrate after DRIE etching of the pattern in FIG. 2e.
Figure 3A:
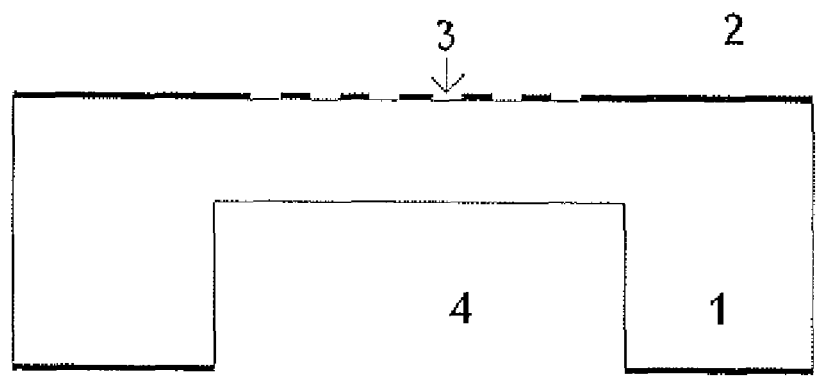
FIG. 3a is a diagram of the substrate shown in 2b after flip out-side-down and photolithography on the backside.
Figure 3B:
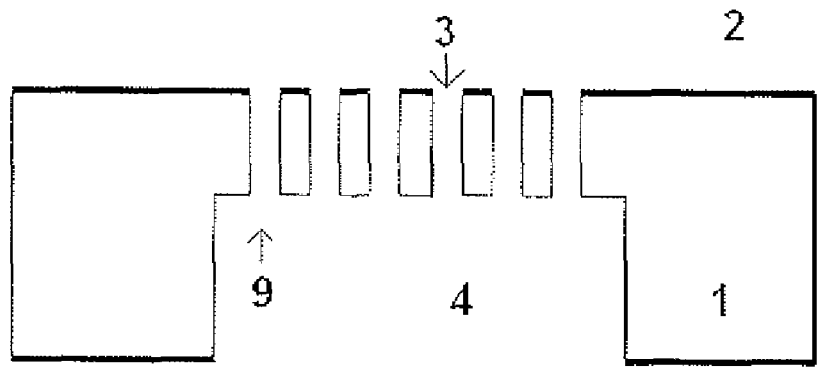
Figure 4:
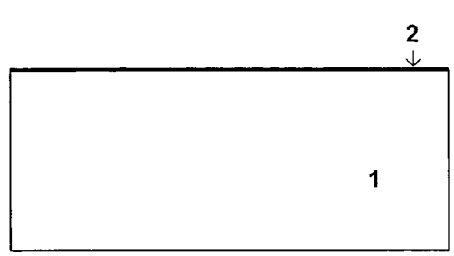
FIG. 4 is a diagram of the substrate covered with the mask film (Cross section and Top view)
Figure 4:
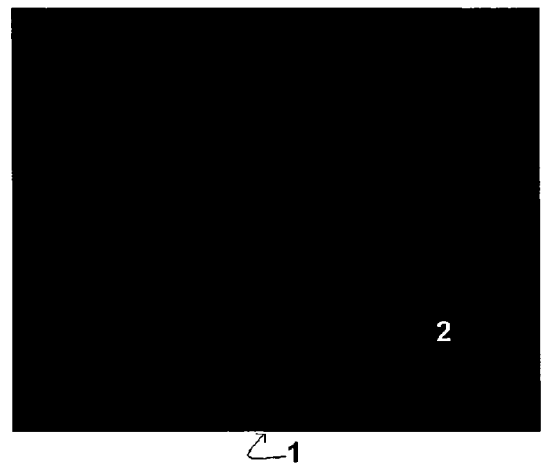
Figure 5:
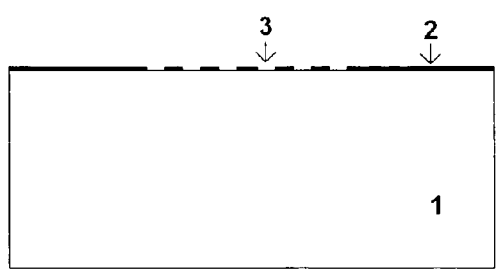
FIG. 5 is a diagram of the openings made in the mask (Cross section and Top view)
Figure 5:
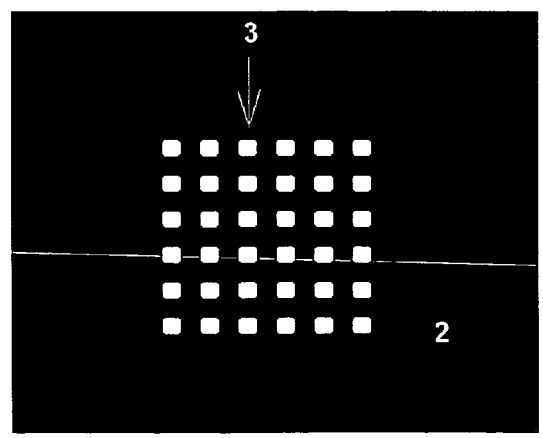

Starting with a silicon wafer substrate, FIG. 4 shows a silicon substrate 1 covered with a photoresist mask 2. The photoresist is then exposed and developed with photolithography technique to produce a patterned mask 3 shown in FIG. 5. The patterned mask presented here is photoresist but this material could be any patterned material that is chemically non reactive with the processing gases used to create the cavity. The mask needs to show enough strain to hold as a cantilever membrane above the intended cavity. For example, commonly used masks are silicon oxide, silicon nitride, metal and spin on glass. They are usually patterned using photolithography and selective stripping. It then leaves the film as the patterned mask 3 in FIG. 5. Another way to form a mask is to etch throughout the whole depth of a first substrate (not shown). This substrate is then bonded to another substrate. The criteria for the masks are always the same: Pattern mask that can hold in tension above the cavity, and which the intrinsic nature is etched at a slower rate than the substrate. Furthermore, the initial thickness needs to be larger than the thickness involuntary etched during the whole process.

Figure 6A:
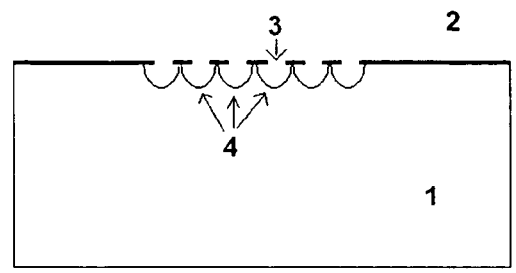
FIG. 6a is a diagram of isotropic etch of the bulk substrate.
Figure 6B:
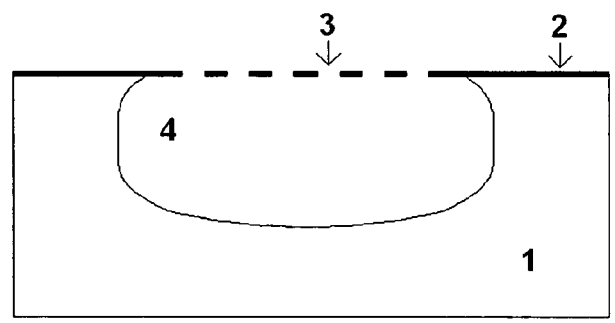
FIG. 6b is a diagram of the cavity etched under the mask (Cross section and Top view)
Figure 6B:
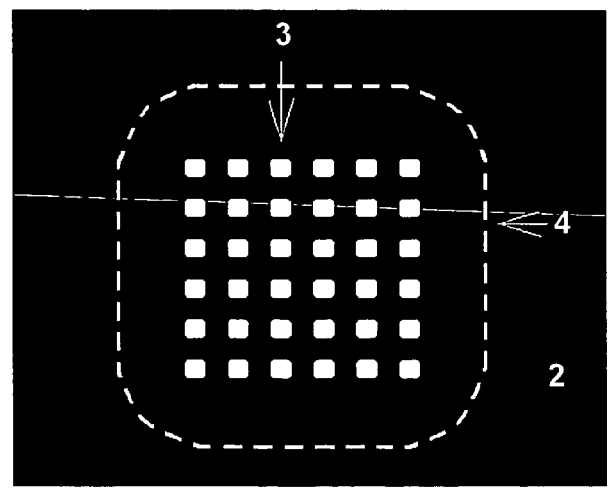

After the mask has been created above the substrate, the substrate is then exposed to a spontaneously reacting enchants species that tend to etch isotropically. This is shown in FIG. 6a. The cavities etched under each opening of the mask 3 will rapidly joint to form a large cavity 4, shown in FIG. 6b. To create this cavity, it is preferable to use a dry etching technique. Using liquid etching techniques would require special handlings to prevent membrane breaking, membrane stiction or in order to prevent liquid to be trapped in the cavity 4. Furthermore, any possible residues need to be avoided in order to process the next step of the invention. In the present work, the cavity was produced using fluorine-rich plasma. Fluorine ions easily react with silicon to form volatile species. It is then pumped away out of the processing chamber and the etching is quasi-isotropic. Many other techniques can be used to create a cavity under a mask. To mention a second example of aways to form a cavity under a mask, reference is made to U.S. Pat. No. 6,712,983, the contents of which are herein incorporated by reference.

Figure 6C:
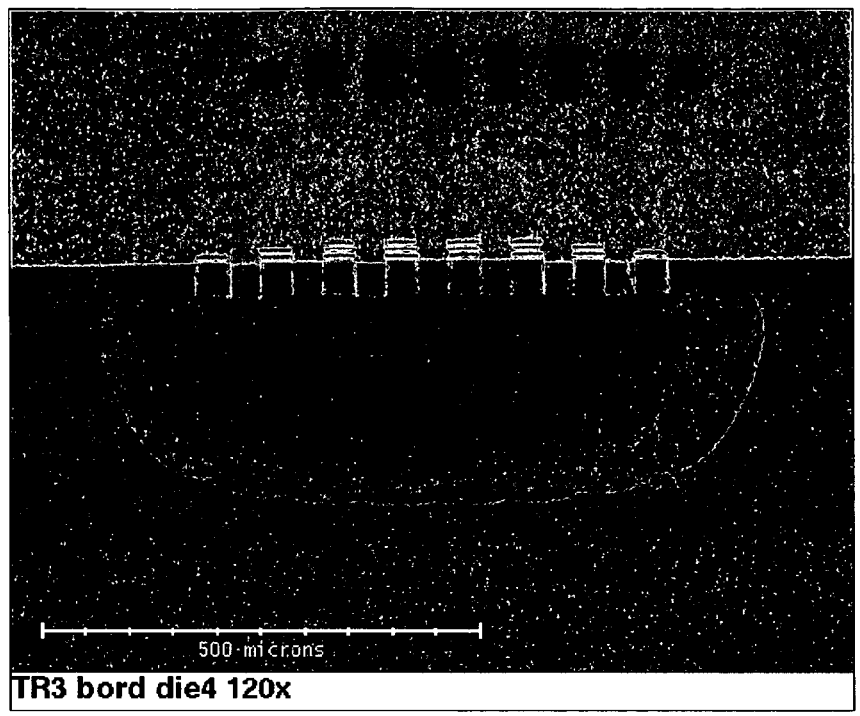
FIG. 6c is a SEM image of a cavity etched under a photoresist mask.
Figure 6D:
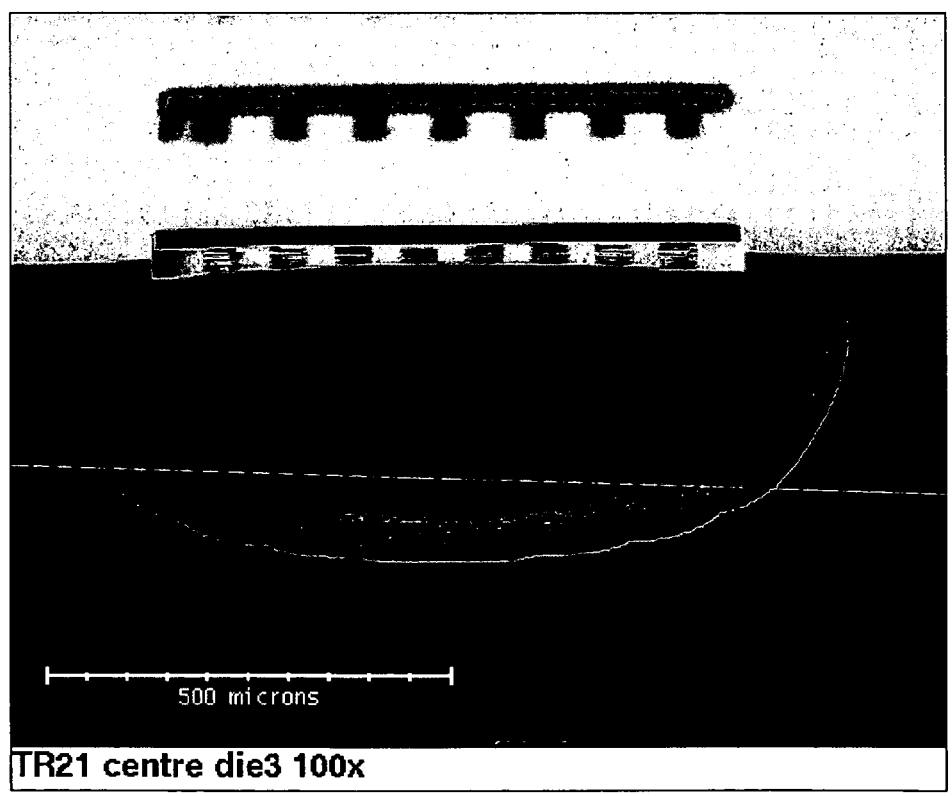
FIG. 6d is a SEM image of a cavity etched under a silicon oxide mask.

FIG. 6c and FIG. 6d show Scanning Electron Microscopy (SEM) images of cavities formed under a photoresist mask and a silicon oxide mask respectively. The thick photoresist mask with a square above the oxide in FIG. 6d is not necessary for the invention. It was used for other purposes. These cavities were produced using the ICP system ASE$^{HRM}$ from Surface Technology System (STS), with a radio-frequency power (RF power) on the coil only (at 3000 W and 2000 W for FIGS. 6c and 6d respectively and, no power applied on the substrate holder), a flow of sulphur hexafluoride; SF6, (500 sccm and 350 sccm for FIGS. 6c and 6d respectively) at a pressure of 60 mTorrs and 40 mTorrs for FIGS. 6c and 6d respectively. In FIG. 6c, the parameters were: (Coil power=3000 W, $SF_6$=500 sccm, Pressure=60 mTorrs, during 36 min); In FIG. 6d, the parameters were: (Coil power=2000 W, $SF_6$=350 sccm, Pressure=40 mTorrs, during 50 min).

Figure 7A:
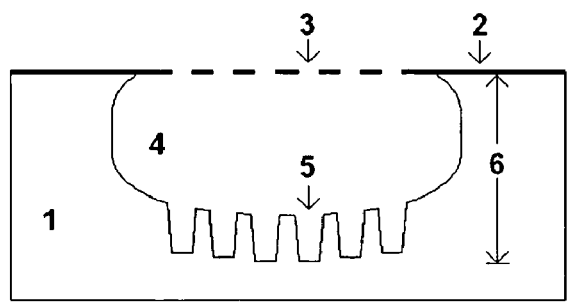
FIG. 7a is a diagram of the etched structure created by DRIE in the bottom of the cavity.

Finally, as shown in FIG. 7a, a DRIE technique is used to create etched structures 5 into the bottom of the cavity that respects the image of the suspended mask. The DRIE technique needs to be capable of high aspect ratios since the aspect ratios that need to be aimed are the total depth 6 over the mask opening dimension 3 rather than, only the depth of the pattern 5 over the mask opening 3. Many DRIE techniques can be used as shown in the literature (U.S. Pat. Nos. 5,501, 893, and 6,127,273). This is generally done in an inductively coupled plasma (ICP) system.

Figure 7B:
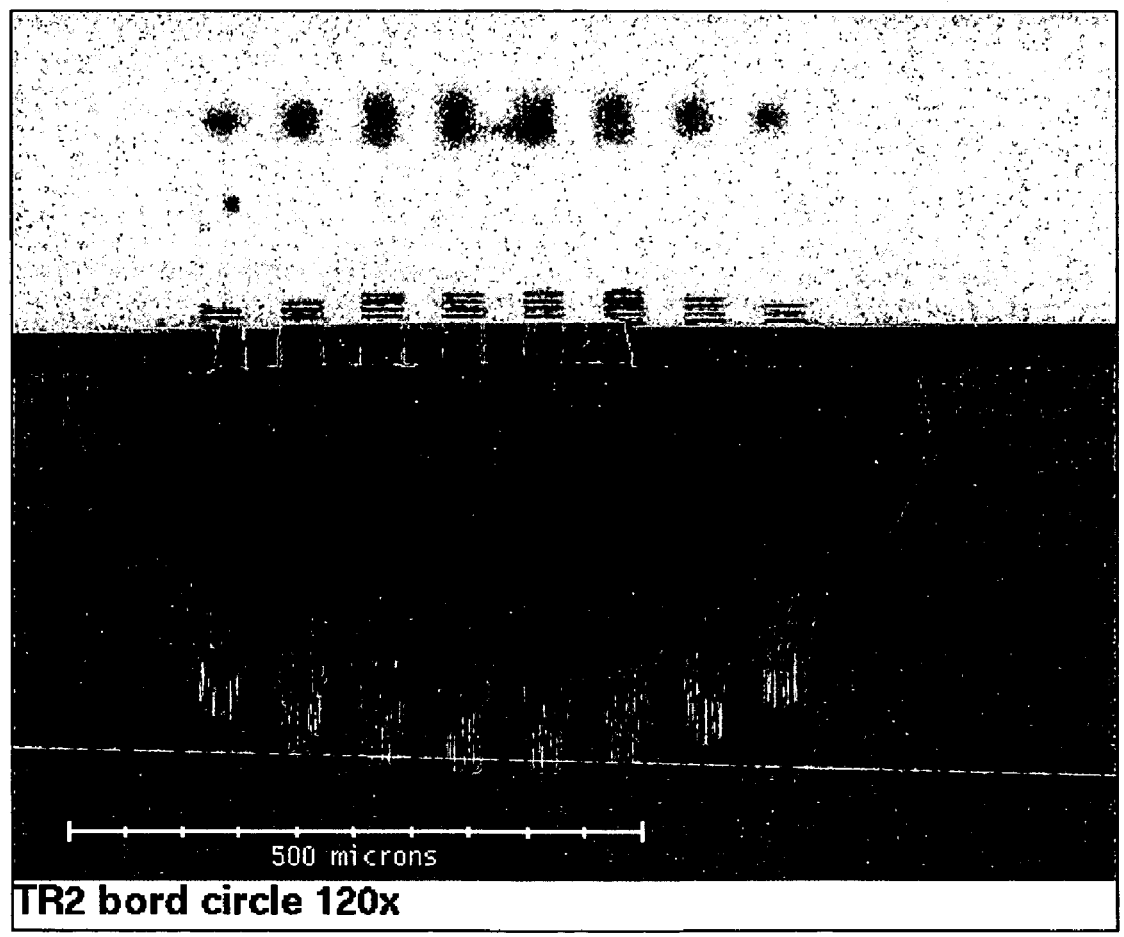
FIG. 7b is a SEM image of an etched pattern in the bottom of the cavity using photoresist mask.
Figure 7C:
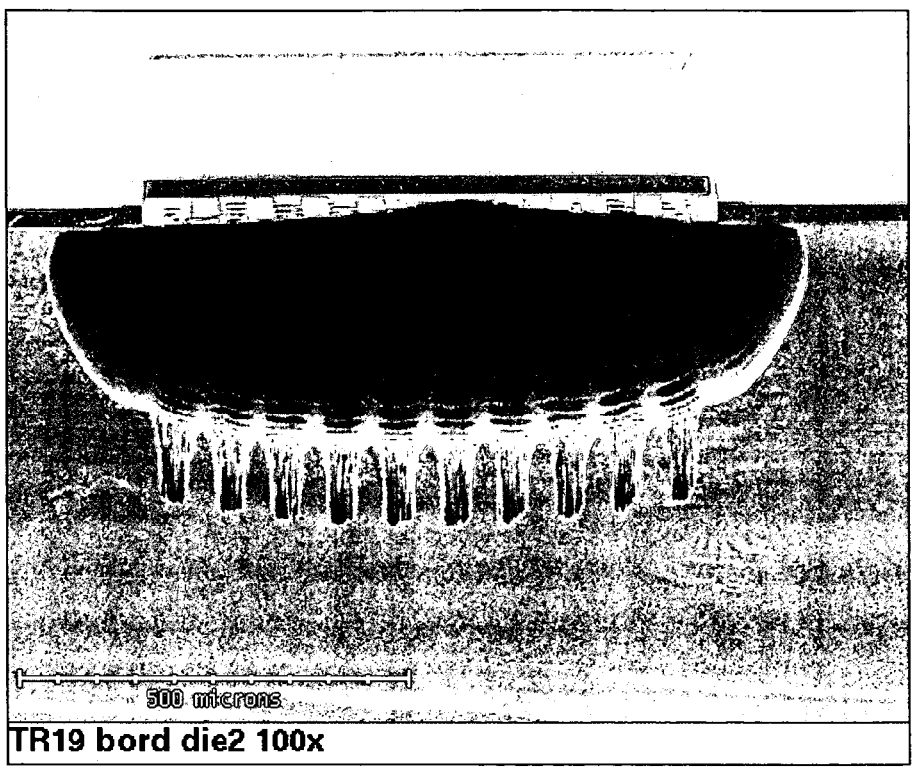
FIG. 7c is a SEM image of an etched pattern in the bottom of the cavity using silicon oxide mask.
Figure 7D:
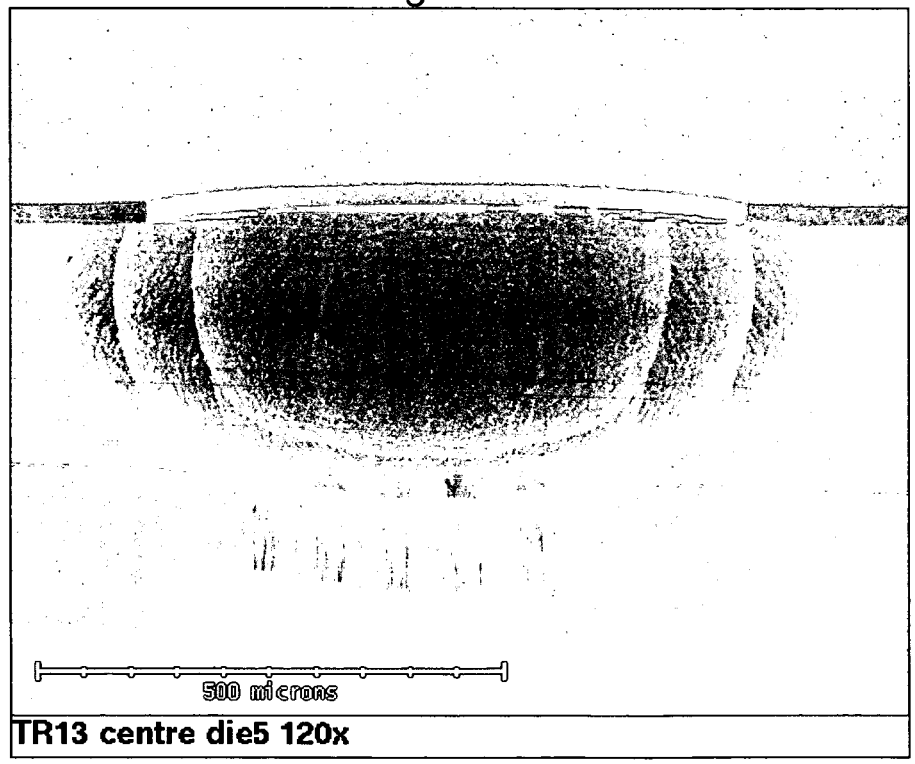
FIG. 7d is a SEM image of an etched pattern in the bottom of the cavity using silicon oxide mask.

FIGS. 7b, 7c and 7d show three SEM micrographs of patterns in the bottom of a cavity under a photoresist and 2 oxide masks. The cavity and the etched pattern were done sequentially in the ICP system ASE$^{HRM}$ STS. The anisotropic etch was performed using the technique described in U.S. Pat. Nos. 5,501,893, and 6,127,273 known as the "Bosch" technique. In FIG. 7b, the parameters were: (Isotropic etch during 53 min 30 sec: Coil power=2000 W, SF6=350 sccm, Pressure=40 mTorrs, followed by a switched "Bosch" recipe 30 min of: Etch [2.5 sec Coil=1750 W, Platen=65 W, $SF_6$=450 sccm, $O_2$=45 sccm]/Passivation [2.0 sec Coil=1100 W, Platen=0 W, $C_4F_8$=125 sccm]); In FIG. 7c, the parameters were: (Isotropic etch during 39 min: Coil power=2000 W, SF6=350 sccm, Pressure=40 mTorrs, followed by a switched "Bosch" recipe 34 min 30 sec of: Etch [2.5 sec Coil=1750 W, Platen=65 W, SF6=450 sccm, O2=45 sccm]/Passivation [2.0 sec Coil=1100 W, Platen=0 W, $C_4F_8$=125 sccm]); In FIG. 7d, the parameters were: (Isotropic etch during 56 min: Coil power=2000 W, SF6=350 sccm, Pressure=40 mTorrs, followed by a switched "Bosch" recipe 19 min 30 sec of: Etch [2.5 sec Coil=1750 W, Platen=65 W, SF6=450 sccm, O2=45 sccm]/Passivation [2.0 sec Coil=1100 W, Platen=0 W, C4F8=125 sccm]).

Figure 8A:
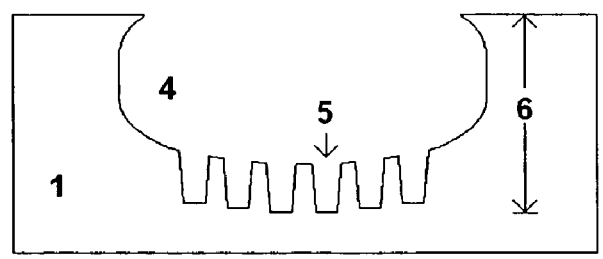
FIG. 8a is a diagram of the micro-machined structure after stripping of the mask layer.
Figure 8B:
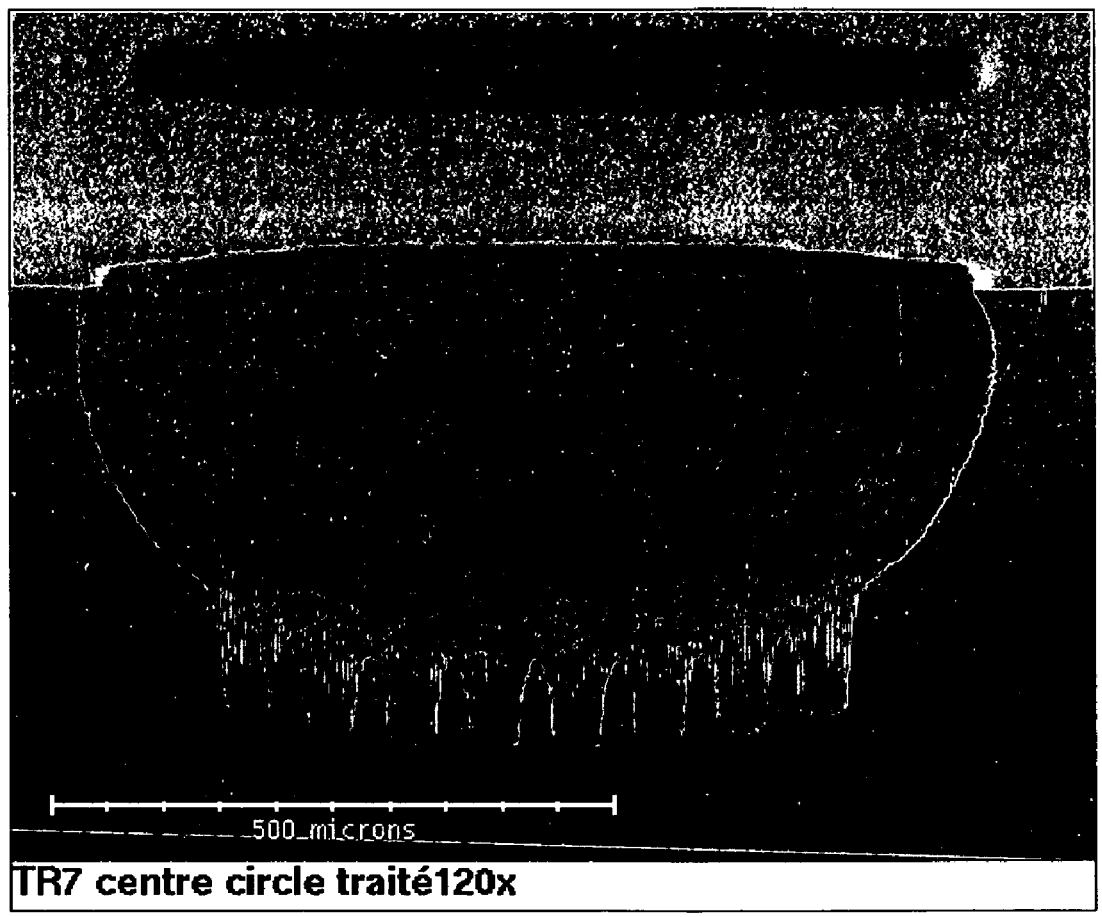
FIG. 8b is a SEM image of a micro-machined structure after stripping.

As shown in FIG. 8a, the mask can optionally be selectively stripped to show a final cavity with pattern in the bottom without membrane. FIG. 8b shows a SEM micrograph of a real device.

Figure 9A:
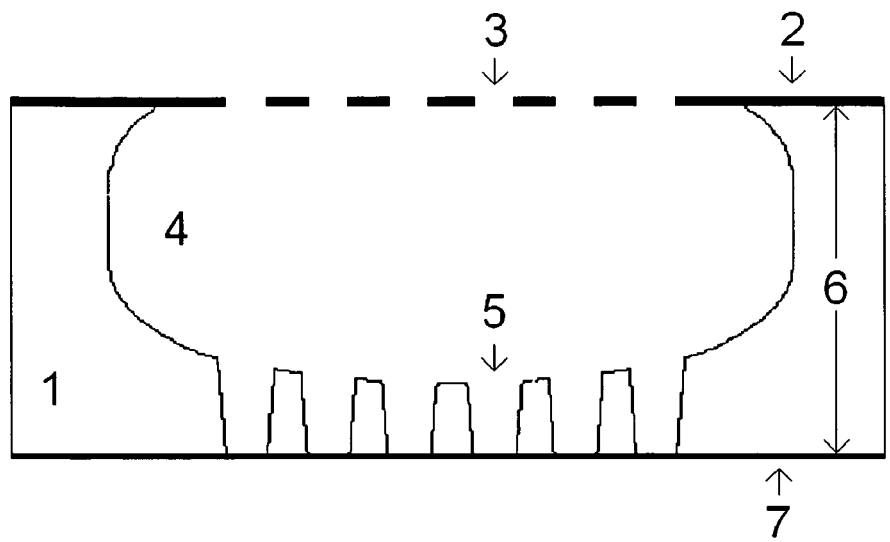
FIG. 9a is a diagram of the micro-machined structure with an etch stop layer.
Figure 9B:
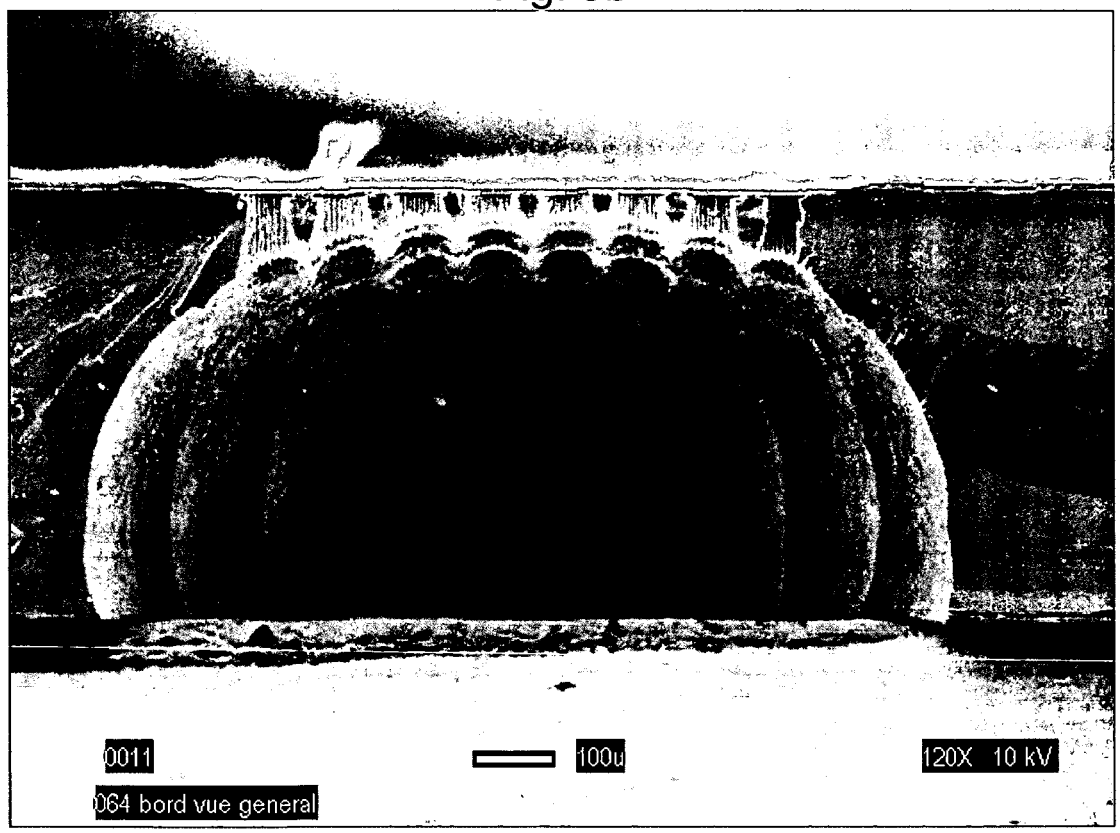
FIG. 9b is a SEM image of a micro-machined structure with an etch stop layer.

When through the wafer vias are needed, FIG. 9a illustrate the usage of an etch stop 7. FIG. 9b shows a SEM image of a device made in Dalsa (Bromont, Canada) (silicon oxide is the etch stop in this case). This etch stop is deposited or grown on the other face of the substrate. This etch stop 7, is necessary since the back side of the substrate usually needs to be cooled with an inert gas (generally helium) that keep the temperature of the substrate stable during DRIE etching. Losing cooling when pinching through would cause loss of dimensions and erosion of the back face.

When selecting the proper mask for its selectivity and thickness, one should consider fast erosion of the mask in the region suspended above the cavity. This is due to the loss of the thermal an electrical conduction for this region. Chase et al. (U.S. Pat. No. 6,500,348 B2) and Rich et al. (U.S. Pat. No. 6,685,844 B2) explain how the pattern etch in a membrane by DRIE can be rapidly eroded. Analogically the mask membrane above a cavity is etched faster than the mask in contact with the substrate. This effect can be minimized by improving thermal and electrical conductance of the mask as explained in U.S. Pat. Nos. 6,500,348 B2 and 6,685,844. This technique is sometimes not wanted for the design and simply having a thicker mask will bypass this disadvantage.

An important feature of the invention is that cavity etching and DRIE patterning can be done in situ within the same piece of equipment. However, it could be done in two pieces of equipments if desired. Using one mask and one etching equipment leads higher throughputs.

I claim:

1. A method of making an etch structure in a substrate comprising:
  a. providing a mask on a surface of the substrate with an array of openings exposing the substrate;
  b. firstly performing an isotropic or quasi-isotropic etch into said surface through the array of openings in the mask to etch away substrate material in contact with the mask and create a common cavity under said openings, said cavity being bounded by the mask and extending into the substrate, said mask thus forming a suspended membrane above the cavity; and
  c. secondly performing a subsequent anisotropic etch through the array of openings in said mask to etch anisotropically a pattern of vertical holes in the bottom of the cavity, said vertical holes being vertically aligned with the array of openings in the mask.

2. The method of claim 1, wherein the anisotropic etch is carried out to etch at least the minimum aspect ratio defined as the depth of the cavity over the opening of the mask.

3. The method according to claim 1, wherein the anisotropic etch is carried out using Deep Reactive Ion Etching (DRIE).

4. The method according to claim 3, wherein the Deep Reactive Ion Etching uses an inductively coupled plasma system.

5. The method according to claim 1, wherein step b employs a dry etching method.

6. The method according to claim 1, wherein step b uses a plasma that contains at least sulphur hexafluoride.

7. The method according to claim 1, wherein step b uses an inductively coupled source in an inductively coupled plasma system, the substrate is mounted in a holder, and no power is applied to the holder.

8. The method according to claim 1, wherein the substrate is silicon.

9. The method according to claim 1, wherein the mask is photoresist.

10. The mask according to claim 9, wherein the mask has a strength such that it can support itself above the cavity after all steps a, b and c have been carried out.

11. The method according to claim 1, wherein the mask is made of a material selected from the group consisting of: silicon oxide, silicon nitride, and spin on glass.

12. The method according to claim 1, further comprising stripping the mask after performing step c.

13. The method according to claim 1, wherein the substrate includes an etch stop layer that acts as an etch stopper at the desired total depth of each hole forming the pattern.

14. The method according to claim 13, wherein the etch stop layer is formed on a back side of the substrate.

15. The method according to claim 1, wherein the mask is deposited on the substrate.

16. The method according to claim 1, wherein the mask is formed by etching through another substrate and bonding said another substrate to said substrate.

17. A method of making a micro microphone component comprising:
   a. providing a hard mask on a surface of the substrate with an array of openings exposing the substrate;
   b. firstly performing an isotropic or quasi-isotropic etch into said surface through the array of openings in the mask to create a common cavity under said openings, said cavity being-bounded by the mask and extending into the substrate, said mask thus forming a suspended membrane above the cavity; and
   c. secondly performing a subsequent anisotropic etch through the array of openings in said mask to etches anisotropically a pattern of vertical vent holes in the bottom of the cavity, said vertical vent holes being vertically aligned with the array of openings in the mask.

18. The method as claimed in claim 17, wherein step b is carried out in the presence of a plasma.

19. The method as claimed in claim 18, wherein step c is carried out using a deep reactive ion etch.

20. A method as claimed in claim 17, further comprising the step of stripping away the mask.

* * * * *